United States Patent
Jeong et al.

(10) Patent No.: US 10,794,553 B1
(45) Date of Patent: Oct. 6, 2020

(54) FLEXIBLE LIGHT-EMITTING DEVICE INCLUDING CONDUCTIVE FIBER

(71) Applicant: DAEGU GYEONGBUK INSTITUTE OF SCIENCE AND TECHNOLOGY, Daegu (KR)

(72) Inventors: Soon Moon Jeong, Daegu (KR); Seong Kyu Song, Daegu (KR); Bo Kyung Song, Daegu (KR); Sang Kyoo Lim, Daegu (KR); Chang Hee Cho, Daegu (KR)

(73) Assignee: DAEGU GYEONGBUK INSTITUTE OF SCIENCE AND TECHNOLOGY, Daegu (KR)

( * ) Notice: Subject to any disclaimer, the term of this patent is extended or adjusted under 35 U.S.C. 154(b) by 0 days.

(21) Appl. No.: 16/811,315

(22) Filed: Mar. 6, 2020

(30) Foreign Application Priority Data

Mar. 12, 2019 (KR) .......................... 10-2019-0027916

(51) Int. Cl.
| | |
|---|---|
| *H01L 51/52* | (2006.01) |
| *F21S 4/24* | (2016.01) |
| *H01L 51/50* | (2006.01) |
| *F21V 8/00* | (2006.01) |
| *C09K 11/54* | (2006.01) |

(Continued)

(52) U.S. Cl.
CPC ................. *F21S 4/24* (2016.01); *C08L 83/04* (2013.01); *C09K 11/0888* (2013.01); *C09K 11/54* (2013.01); *G02B 6/0005* (2013.01); *H01L 51/502* (2013.01)

(58) Field of Classification Search
CPC .......... F21S 4/24; G02B 6/005; H01L 51/502; H01L 51/5032; C09K 11/54; C09K 11/0888
See application file for complete search history.

(56) References Cited

U.S. PATENT DOCUMENTS

| | | | |
|---|---|---|---|
| 9,362,519 B2 * | 6/2016 | Siegel ..................... | H01L 51/56 |
| 2015/0236289 A1 * | 8/2015 | Siegel ................. | H01L 51/5032 |
| | | | 257/13 |

(Continued)

FOREIGN PATENT DOCUMENTS

| | | |
|---|---|---|
| KR | 10-2014-0128528 | 11/2014 |
| KR | 10-2016-0004391 | 1/2016 |

(Continued)

*Primary Examiner* — Karabi Guharay
(74) *Attorney, Agent, or Firm* — Lex IP Meister, PLLC

(57) ABSTRACT

Provided is a flexible light-emitting device including: a light-emitting complex medium including a polymer matrix, and a nano light-emitting material dispersed therein, the light-emitting complex medium generating light via application of an electric field thereto; a plurality of first fiber electrodes extending in a first direction and disposed within the light-emitting complex medium, wherein the plurality of first fiber electrodes are arranged along a first imaginary plane and are spaced apart from each other, wherein a first voltage is applied to the plurality of first fiber electrodes; and a plurality of second fiber electrodes extending in the first direction and disposed within the light-emitting complex medium, wherein the plurality of first fiber electrodes are alternated with the plurality of second fiber electrodes, wherein a second voltage different from the first voltage is applied to the plurality of second fiber electrodes.

12 Claims, 9 Drawing Sheets

(51) Int. Cl.
*C08L 83/04* (2006.01)
*C09K 11/08* (2006.01)

(56) References Cited

U.S. PATENT DOCUMENTS

2018/0301653 A1* 10/2018 Yonekawa ............ C09K 11/025
2018/0366646 A1* 12/2018 Yonekawa ............ C07F 9/5407

FOREIGN PATENT DOCUMENTS

KR   10-2018-0013115   2/2018
KR   10-1945128        2/2019

* cited by examiner

[FIG. 1A]
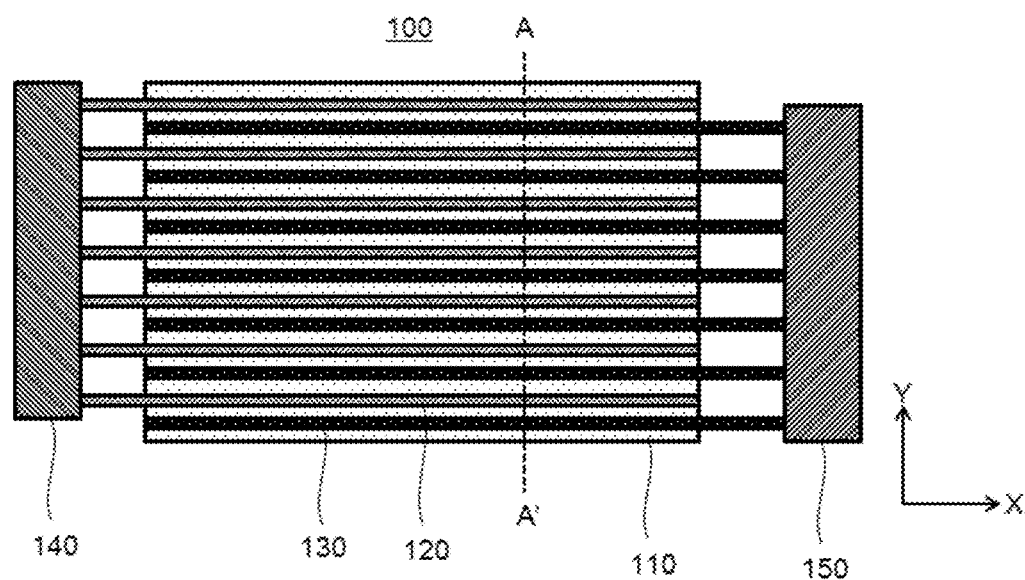
[FIG. 1B]
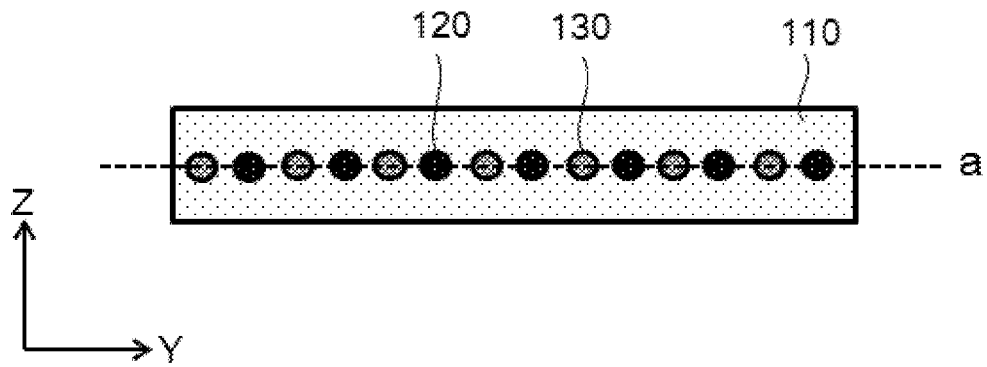

[FIG. 1C]
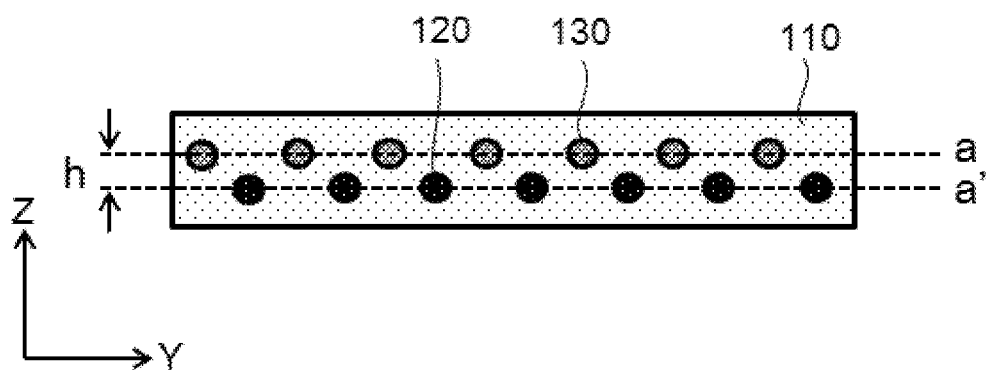
[FIG. 2]
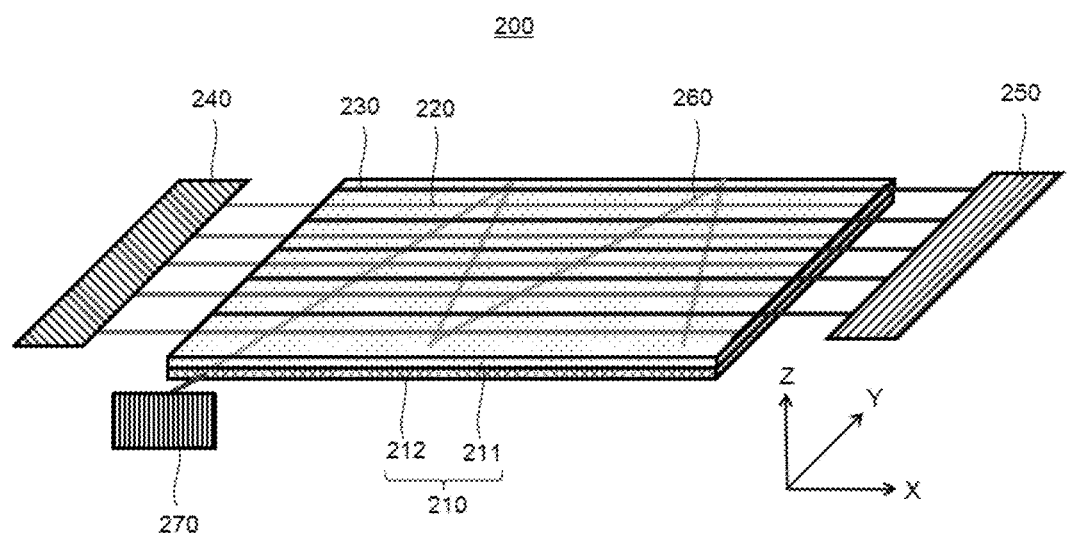

[FIG. 3]
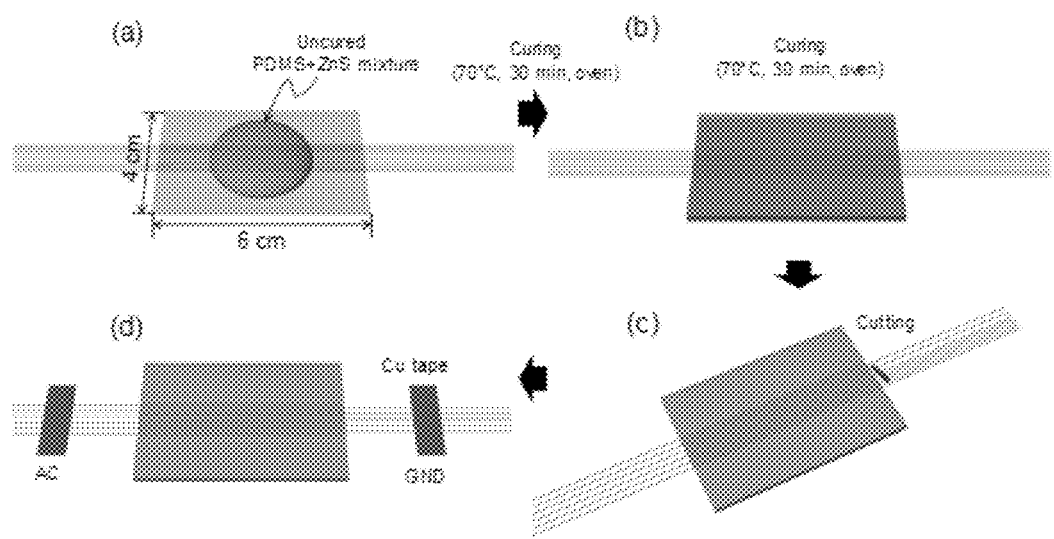

[FIG. 4]
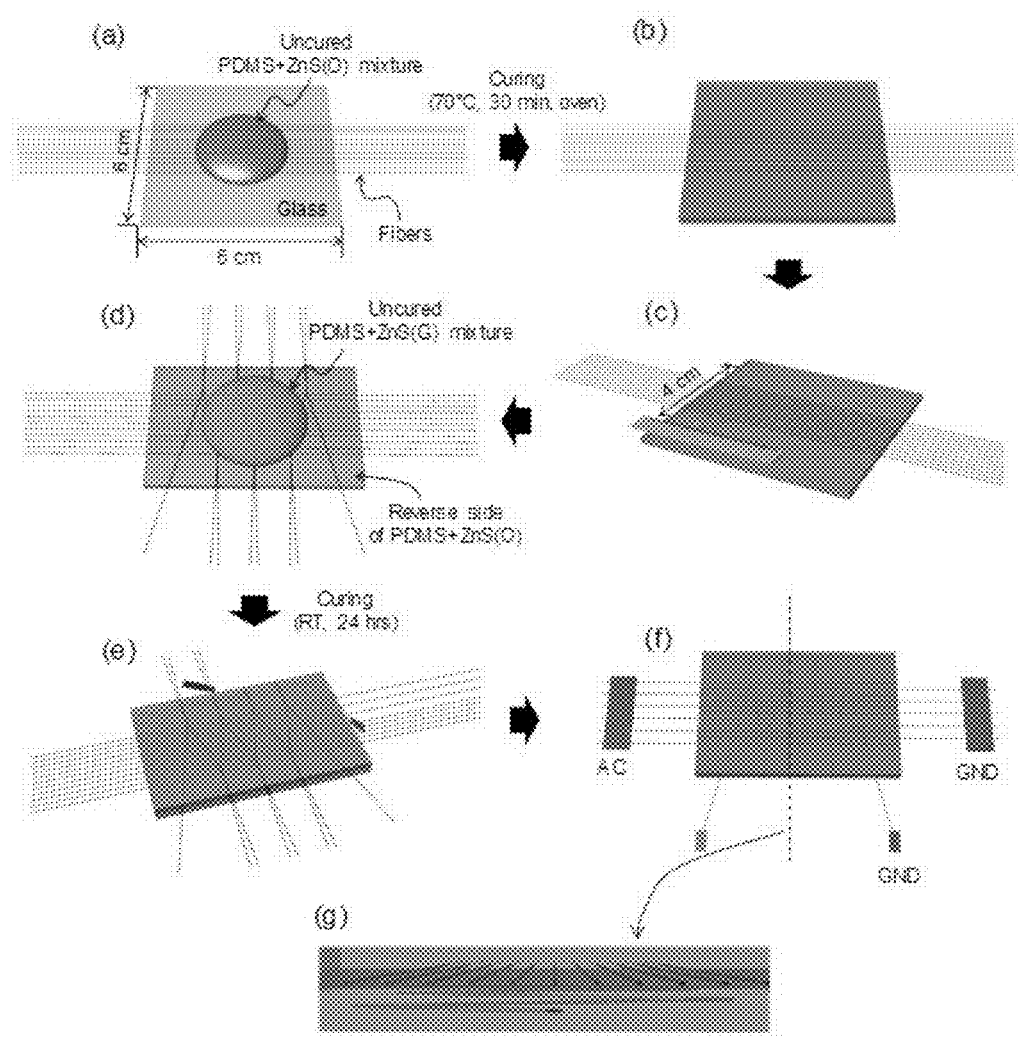

[FIG. 5A]
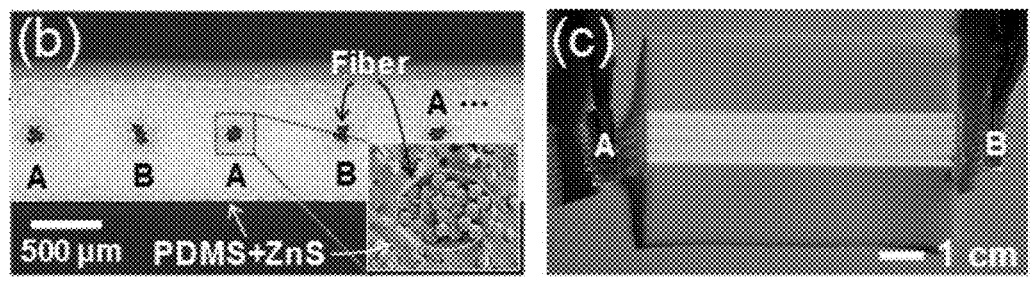
[FIG. 5B]
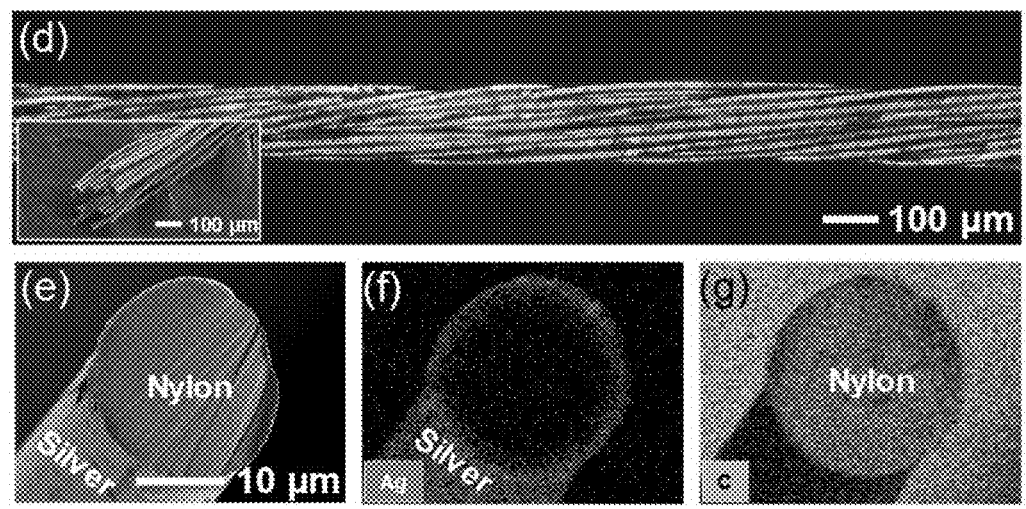
[FIG. 5C]
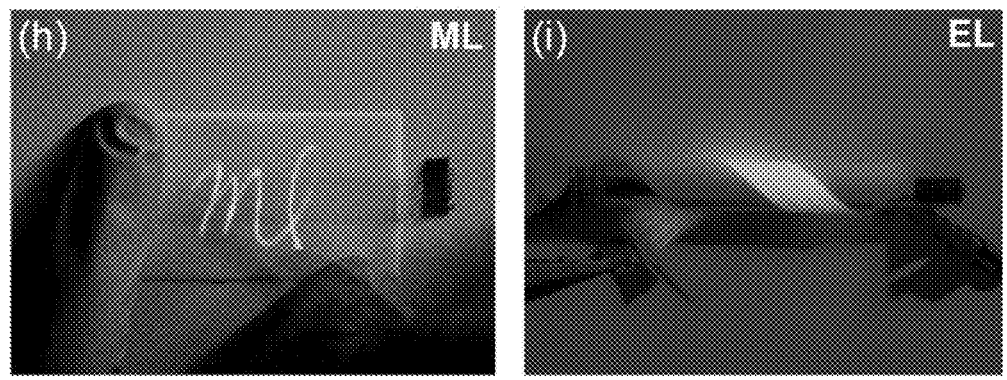

[FIG. 6]
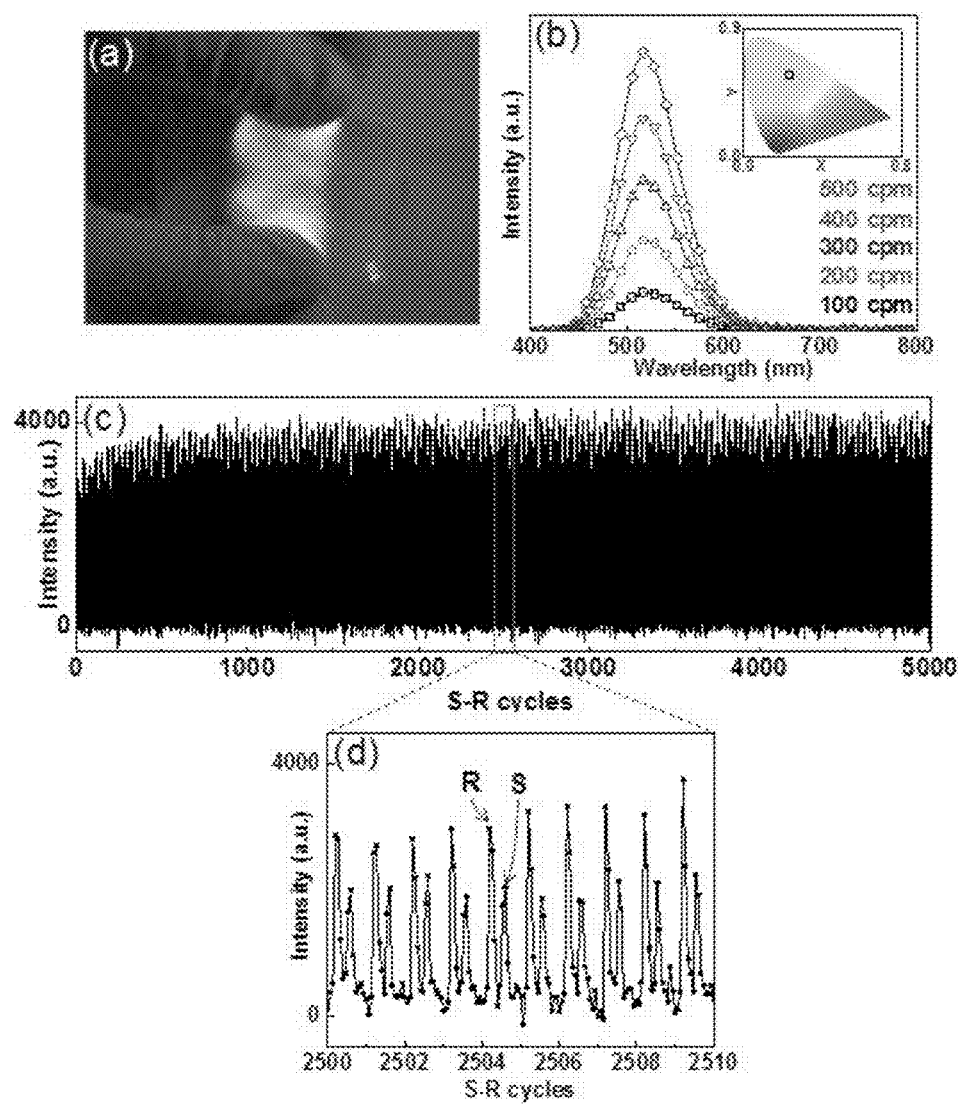

[FIG. 7]
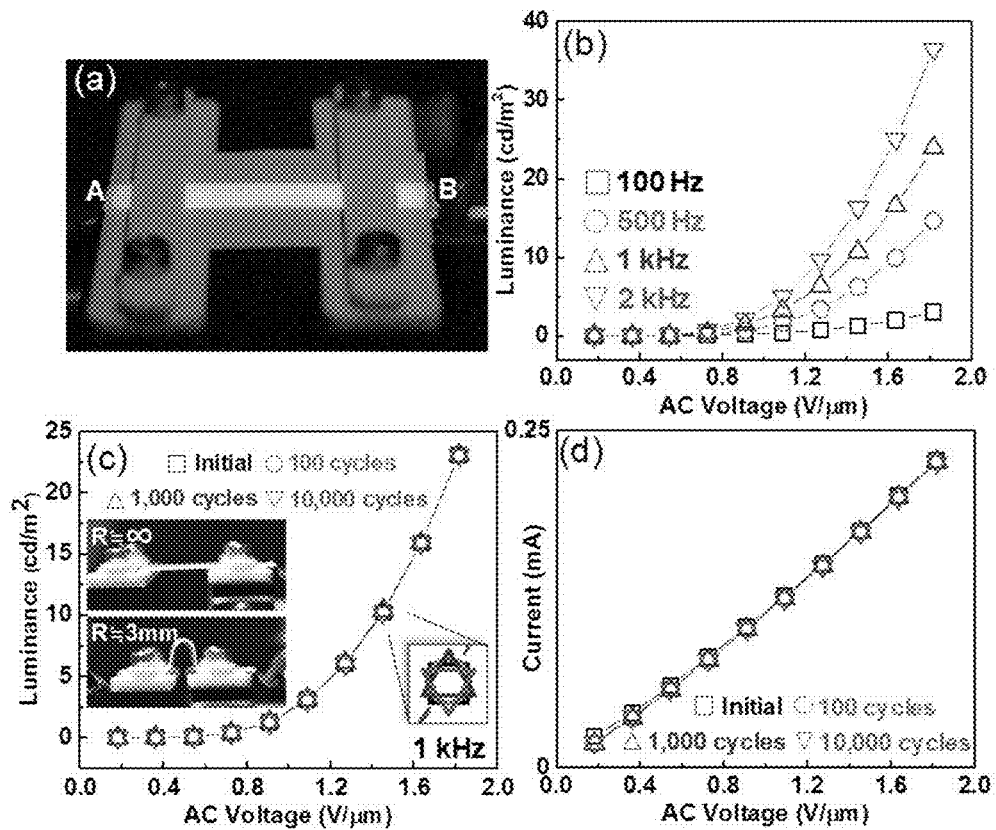
[FIG. 8A]
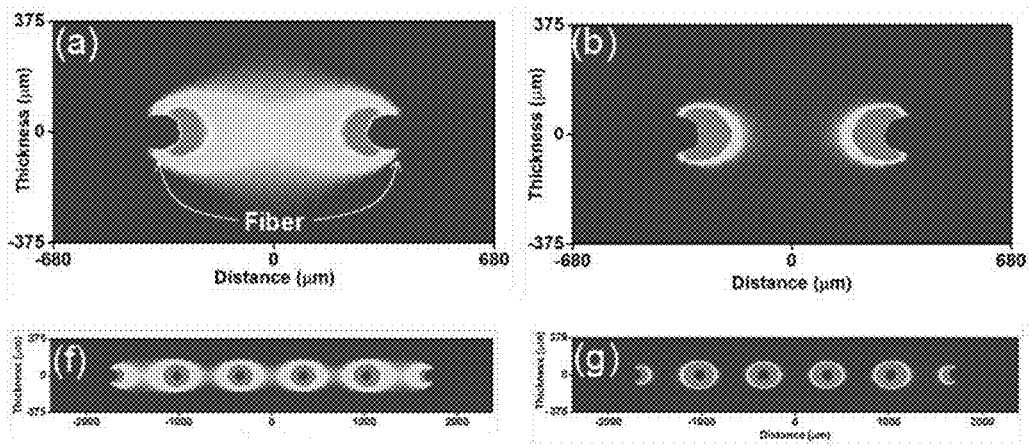

[FIG. 8B]
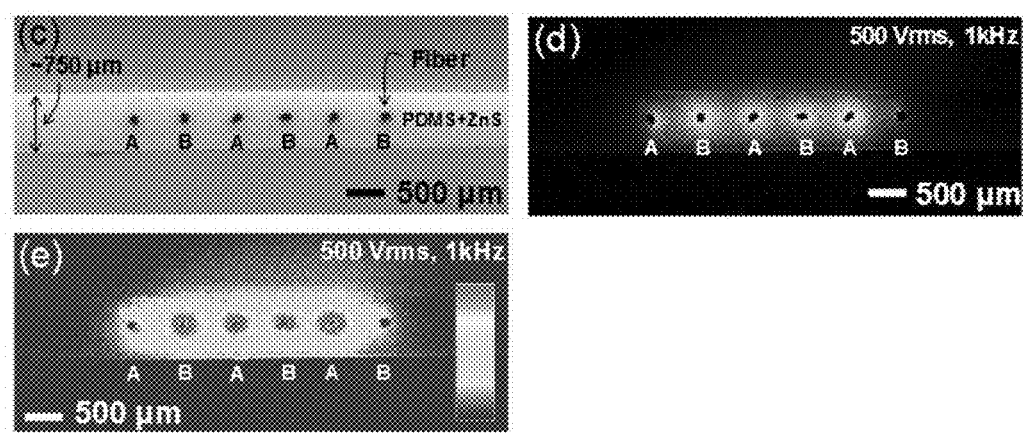
[FIG. 8C]
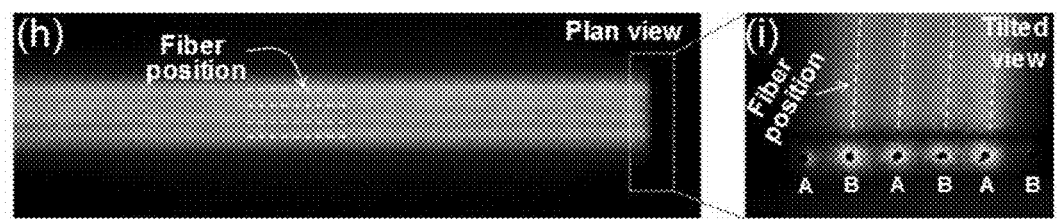

[FIG. 9]
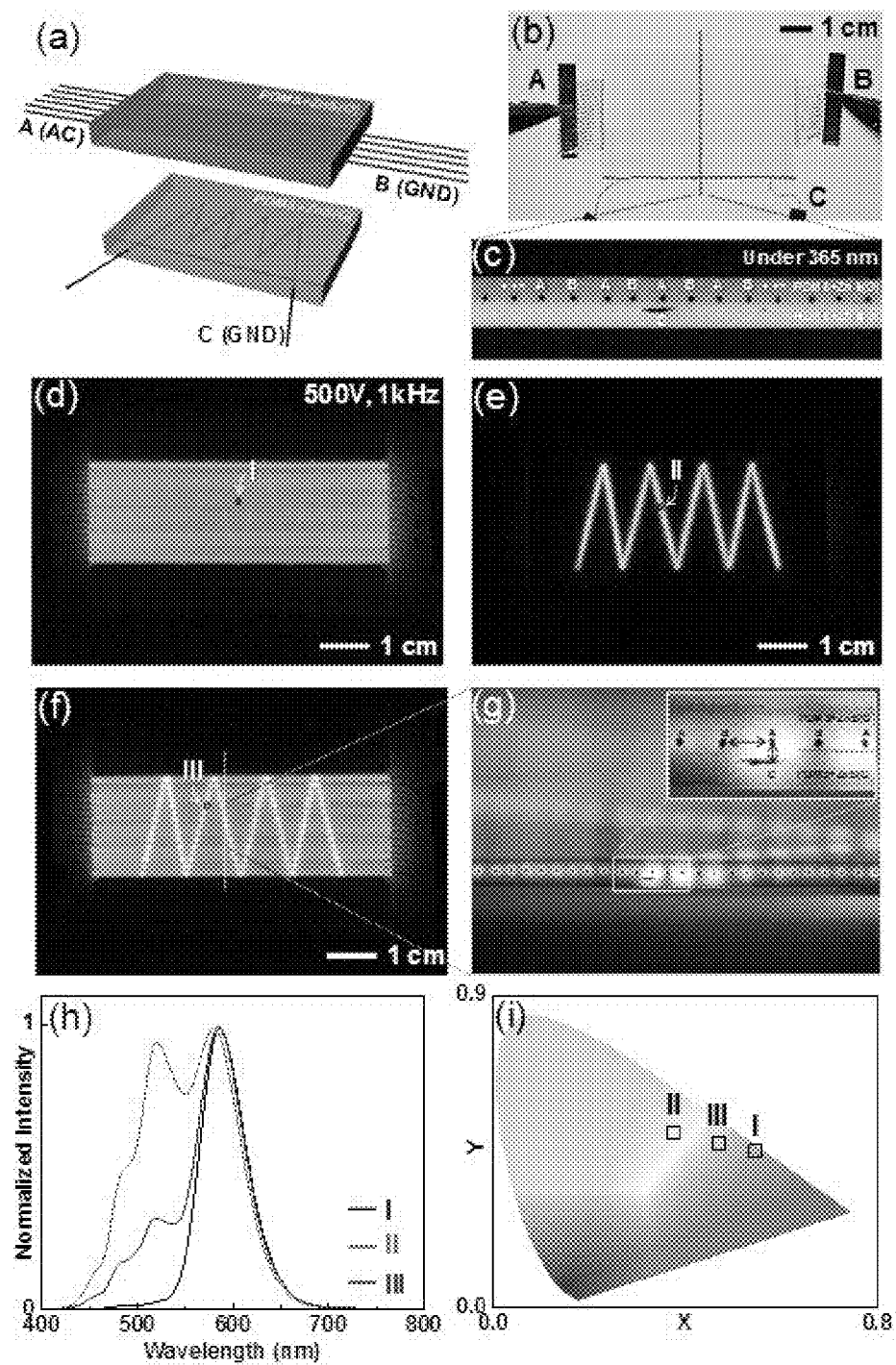

FLEXIBLE LIGHT-EMITTING DEVICE INCLUDING CONDUCTIVE FIBER

CROSS-REFERENCE TO RELATED APPLICATION

This application claims a benefit under 35 U.S.C. § 119(a) of Korean Patent Application No. 10-2019-0027916 filed on Mar. 12, 2019, on the Korean Intellectual Property Office, the entire disclosure of which is incorporated herein by reference for all purposes.

BACKGROUND

1. Field

The present disclosure relates to a flexible light-emitting device having surface light emission.

2. Description of Related Art

A conventional electroluminescence element has a structure in which two planar electrodes face each other with a light-emitting layer interposed therebetween. Light is emitted from the light-emitting layer when an electric field generated by the two planar electrodes is applied to the light-emitting layer.

In the electroluminescence element having such a structure, a technique for forming the electrodes using silver nanowires (AgNW), carbon nanotubes (CNT), etc. has been developed to improve flexibility. However, in order to increase an electrical conductivity of the electrode made of such materials, it is necessary to increase a density of the material or increase a thickness of the electrode. In this case, there is a problem that light transmittance of the electrode is lowered, thereby reducing light extraction efficiency of the electroluminescence element. Further, in the electroluminescence element having such a structure, light generated from the light-emitting layer must pass through one of the electrodes in order to be extracted to an outside. Thus, the electrode through which light passes must be made of a material having very high light transmittance, and as a result, a type of the material applicable to the electrode is limited.

In a light-emitting element capable of electroluminescence (EL) and mechanical light emission (ML) simultaneously, in order to apply a strong electric field to the light-emitting layer, a thickness of the light-emitting layer must be reduced. In this case, there is a problem that performance of the mechanical light emission is reduced due to the reduced thickness of the light-emitting layer. Increasing the thickness of the light-emitting layer causes a problem that performance of the electroluminescence is degraded.

Therefore, there is a need for development of a light-emitting element having a structure that may fundamentally solve the problem as described above.

SUMMARY

This Summary is provided to introduce a selection of concepts in a simplified form that are further described below in the Detailed Description. This Summary is not intended to identify all key features or essential features of the claimed subject matter, nor is it intended to be used alone as an aid in determining the scope of the claimed subject matter.

One purpose of the present disclosure is to provide a flexible light-emitting device in which fiber electrodes disposed inside a light-emitting complex medium are used to generate an in-plane electric field, which in turn allows the light-emitting complex medium to emit light, thereby to generate light with high efficiency regardless of a material of the fiber electrode or a thickness of light-emitting complex medium.

Purposes in accordance with the present disclosure are not limited to the above-mentioned purpose. Other purposes and advantages in accordance with the present disclosure as not mentioned above may be understood from following descriptions and more clearly understood from embodiments in accordance with the present disclosure. Further, it will be readily appreciated that the purposes and advantages in accordance with the present disclosure may be realized by features and combinations thereof as disclosed in the claims.

In a first aspect of the present disclosure, there is provided a flexible light-emitting device comprising: a light-emitting complex medium including a polymer matrix, and a nano light-emitting material dispersed therein, the light-emitting complex medium generating light via application of an electric field thereto; a plurality of first fiber electrodes extending in a first direction and disposed within the light-emitting complex medium, wherein the plurality of first fiber electrodes are arranged along a first imaginary plane and are spaced apart from each other, wherein a first voltage is applied to the plurality of first fiber electrodes; and a plurality of second fiber electrodes extending in the first direction and disposed within the light-emitting complex medium, wherein the plurality of first fiber electrodes are alternated with the plurality of second fiber electrodes, wherein a second voltage different from the first voltage is applied to the plurality of second fiber electrodes.

In one implementation of the first aspect, the second fiber electrodes are arranged along the first imaginary plane.

In one implementation of the first aspect, the second fiber electrodes are arranged along a second imaginary plane different from the first imaginary plane.

In one implementation of the first aspect, the polymer matrix includes at least one selected from a group consisting of polydimethylsiloxane (PDMS), polymethylmethacrylate (PMMA), polycarbonate (PC), polyimide (PI), polyethylene (PE), polypropylene (PP), methacrylic, ployurethane, and polyethylene terephthalate (PET).

In one implementation of the first aspect, the nano light-emitting material includes a quantum dot.

In one implementation of the first aspect, each of the first fiber electrodes and the second fiber electrodes includes a conductive fiber having electrical conductivity.

In one implementation of the first aspect, the flexible light-emitting device further comprises: a first voltage application member electrically connected to the first fiber electrodes for applying the first voltage to the first fiber electrodes; and a second voltage application member electrically connected to the second fiber electrodes for applying the second voltage to the second fiber electrodes.

In one implementation of the first aspect, the first voltage is an alternating current (AC) voltage and the second voltage is a ground voltage.

In one implementation of the first aspect, the polymer matrix is made of polydimethylsiloxane (PDMS), wherein the nano light-emitting material includes a zinc sulfide (ZnS) quantum dot, wherein the light-emitting complex medium generates first light using the electric field applied thereto and generates second light using mechanical stimulus applied thereto.

In a second aspect of the present disclosure, there is provided a flexible light-emitting device comprising: a light-emitting complex medium including: a first medium layer including a first polymer matrix, and a first nano light-emitting material dispersed therein; and a second medium layer including a second polymer matrix, and a second nano light-emitting material dispersed therein, wherein the second medium layer is stacked on the first medium layer; a plurality of first fiber electrodes extending in a first direction and disposed within the first medium layer, wherein the plurality of first fiber electrodes are arranged along a first imaginary plane and are spaced apart from each other, wherein a first voltage is applied to the plurality of first fiber electrodes; a plurality of second fiber electrodes extending in the first direction and disposed within the first medium layer, wherein the plurality of first fiber electrodes are alternated with the plurality of second fiber electrodes, wherein a second voltage different from the first voltage is applied to the plurality of second fiber electrodes; and a third fiber electrode located within the second medium layer, wherein a third voltage is applied to the third fiber electrode.

In one implementation of the second aspect, the first polymer matrix and the second polymer matrix are made of the same material.

In one implementation of the second aspect, the first voltage is an alternating current voltage, the second voltage is ground voltage, and the third voltage is one of the alternating current voltage and the ground voltage.

Effects in accordance with the present disclosure may be as follows but may not be limited thereto.

In the flexible light-emitting device in accordance with the present disclosure, the in-plane electric field generated between the fiber electrodes disposed inside the light-emitting complex medium may be used to generate light and, further, the generated light does not have to pass through the fiber electrodes when the generated light is emitted to an outside. Thus, even when the fiber electrode is made of a material with low light transmittance, the device may emit the light at high efficiency. Further, the light may be generated at high efficiency regardless of a thickness of the light-emitting complex medium. Those are advantages over the conventional light-emitting device in which the light-emitting layer is disposed between the two electrodes having the planar structure, and thus, when light generated from the light-emitting layer is emitted to the outside, the light must pass through one of the two planar electrodes.

In addition to the effects as described above, specific effects in accordance with the present disclosure will be described together with the detailed description for carrying out the disclosure.

BRIEF DESCRIPTION OF DRAWINGS

FIG. 1A is a plan view illustrating a flexible light-emitting device according to an embodiment of the present disclosure.

FIG. 1B and FIG. 1C are cross-sectional views of different embodiments as taken along a cut line A-A' shown in FIG. 1A.

FIG. 2 is a perspective view illustrating a flexible light-emitting device according to another embodiment of the present disclosure.

FIG. 3 is a view for illustrating a method of manufacturing a light-emitting device according to Present Example 1.

FIG. 4 is a view for illustrating a method for manufacturing a light-emitting device according to Present Example 2.

FIG. 5A shows optical and SEM cross-sectional images (b) of a light-emitting device of Present Example 1 and a photograph (c) showing electroluminescence under 500 Vrms voltage application condition at 1 KHz frequency of Present Example 1.

FIG. 5B shows optical and SEM images (d, e) and EDS images (f, g) of 130 μm diameter Ag-coated nylon fiber having dozens of nylon yarns and a 200 nm thick Ag coating layer.

FIG. 5C shows photographs showing ML light emission (h) induced by pen stimulation to the light-emitting device of Present Example 1, and EL light emission (i) while the light-emitting device of Present Example 1 is wound around the pen.

FIG. 6 shows a photograph (a) of ML light emission induced by pulling of the light-emitting device of Present Example 1 by hand, ML light-emission spectrum (b) based on a stretching-releasing (S-R) rate increasing from 100 cpm (cycles per minute) to 500 cpm (cycles per minute), and ML intensity (c) over time as obtained by integrating an spectral intensity from 400 nm to 800 nm over 5000 cycles, and a magnified graph (d) thereof.

FIG. 7 shows a photograph (a) of EL light-emission as measured in the light-emitting device in Present Example 1, a graph (b) showing a voltage-luminance relationship under conditions of various frequencies (100, 500, 1000 and 2000 Hz), and a voltage-luminance graph (c) and a voltage-current graph (d) based on a bending cycle.

FIG. 8A shows images showing simulated electric field distribution (a) and optical field distribution (b) in a light-emitting element with a pair of fiber electrodes, and images showing simulated electric field distribution (f) and optical field distribution (g) in a light-emitting element having a plurality of pairs of fiber electrodes.

FIG. 8B shows a cross-sectional image (c) when AC voltage is applied to the light-emitting device of Present Example 1 having multiple of pairs of fiber electrodes, and a cross-sectional image (d) when the AC voltage is not applied thereto, and a contour image (e) evaluated in terms of a light intensity thereof.

FIG. 8C shows images of light emission of the light-emitting device of Present Example 1.

FIG. 9 shows schematic images (a, b) of a light emitting device of Present Example 2, an orange background light-emission image (d), a green zig-zag pattern light-emission image (e), simultaneous light-emission images (f and g) of an orange background and a green zig-zag pattern, and EL spectrum (h) and CIE coordinates at positions I, II and III shown in (d) to (f).

DETAILED DESCRIPTIONS

For simplicity and clarity of illustration, elements in the figures are not necessarily drawn to scale. The same reference numbers in different figures denote the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

The terminology used herein is for the purpose of describing particular embodiments only and is not intended to limit the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers.

It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1A is a plan view illustrating a flexible light-emitting device according to an embodiment of the present disclosure. FIG. 1B and FIG. 1C are cross-sectional views of different embodiments as taken along a cut line A-A' shown in FIG. 1A.

Referring to FIG. 1A to FIG. 1C, a flexible light-emitting device 100 according to one embodiment of the present disclosure includes a light-emitting complex medium 110, a plurality of first fiber electrodes 120, a plurality of second fiber electrodes 130, a first voltage application member 140 and a second voltage application member 150.

The light-emitting complex medium 110 may include a polymer matrix and a nano light-emitting material dispersed therein, and may generate light via application of an electric field thereto.

A material of the polymer matrix is not particularly limited as long as it is transparent and flexible. For example, the polymer matrix may be made of polydimethylsiloxane (PDMS), polymethylmethacrylate (PMMA), polycarbonate (PC), polyimide (PI), polyethylene (PE), polypropylene (PP), methacrylic, ployurethane, polyethylene terephthalate (PET), etc. The polymer matrix may have a sheet structure with a constant thickness. The thickness of the polymer matrix may be appropriately changed depending on an application to which the polymer matrix is applied.

The nano light-emitting material may be uniformly dispersed within the polymer matrix and may generate light in a particular wavelength range via application of an electric field thereto. In one embodiment, the nano light-emitting material may include a quantum dot as a semiconductor nanocrystal.

The quantum dot refers to a semiconductor nanocrystal particle of several to tens of nanometers in size. The quantum dot has a band gap discontinuously quantized by a quantum confinement effect. When energy above the band gap is applied thereto, the quantum dot absorbs the energy to emit light having a wavelength corresponding to the band gap. A wavelength of the light generated from the quantum dot may be controlled by a size, composition, etc. of the quantum dot.

The quantum dot may include a known quantum dot without limitation. For example, the quantum dot may be made of II-VI group compound, II-V group compound, III-V group compound, III-IV group compound, III-VI group compound, IV-VI group compound or mixtures thereof. The "mixture" includes not only simple mixtures of the compounds, but also ternary compounds, quaternary compounds, and the mixtures having dopants doped therein.

Examples of the II-VI group compounds may include magnesium sulfide (MgS), magnesium selenide (MgSe), magnesium telluride (MgTe), calcium sulfide (CaS), calcium selenide (CaSe), calcium telluride (CaTe), strontium sulfide (SrS), strontium selenide (SrSe), strontium telluride (SrTe), cadmium sulfide (CdS), cadmium selenide (CdSe), tellurium cadmium (CdTe), zinc sulfide (ZnS), zinc selenide (ZnSe), zinc telluride (ZnTe), mercury sulfide (HgS), mercury selenide (HgSe), mercury telluride (HgTe), etc.

Examples of the II-V group compounds may include zinc phosphide ($Zn_3P_2$), zinc arsenide ($Zn_3As_2$), cadmium phosphide ($Cd_3P_2$), cadmium arsenide ($Cd_3As_2$), cadmium nitride ($Cd_3N_2$) or zinc nitride ($Zn_3N_2$).

Examples of the III-V group compounds may include boron phosphide (BP), aluminum phosphide (AlP), aluminum arsenide (AlAs), antimony monoxide (AlSb), gallium nitride (GaN), gallium phosphide (GaP), gallium arsenide (GaAs), gallium antimony (GaSb), indium nitride (InN), indium phosphide (InP), indium arsenide (InAs), indium antimony (InSb), aluminum nitride (AlN), boron nitride (BN), etc.

Examples of the III-IV group compounds may include boron carbide ($B_4C$), aluminum carbide ($Al_4C_3$), gallium carbide ($Ga_4C$), and the like.

Examples of the III-VI group compounds may include aluminum sulfide ($Al_2S_3$), aluminum selenide ($Al_2Se_3$), aluminum telluride ($Al_2Te_3$), gallium sulfide ($Ga_2S_3$), gallium selenide ($Ga_2Se_3$), indium sulfide ($In_2S_3$), indium selenide ($In_2Se_3$), gallium telluride ($Ga_2Te_3$), indium telluride ($In_2Te_3$). Etc.

Examples of the IV-VI group compound may include lead sulfide (PbS), lead selenide (PbSe), lead telluride (PbTe), tin sulfide (SnS), tin selenide (SnSe), tin telluride (SnTe), and the like.

In one example, the quantum dot may have a single core structure having a single core or a core/shell structure including a core and a shell surrounding the core.

Each of the core and the shell of the quantum dot may be made of the compounds as exemplified above. For example, the above compounds may constitute the core or shell alone or in combination of two or more thereof. A bandgap of the compound constituting the core may be narrower than a bandgap of the compound constituting the shell. However, the present disclosure is not limited thereto. When the quantum dot has the core/shell structure, the compound constituting the shell may be different from the compound constituting the core.

In one example, the nano light-emitting material may further include a ligand coupled to a surface of each of the quantum dots to prevent the quantum dots from agglomerating with each other and quenching. The ligand may include any known quantum dot ligand without limitation. For example, the ligand may include an alkyl group having 6 to 30 carbon atoms, an amine compound having an alkenyl group, a carboxylic acid compound, a phosphine oxide compound, a pyridine compound, a thiophene compound, and the like.

The plurality of first fiber electrodes 120 and the plurality of second fiber electrodes 130 may extend in parallel with each other in a first direction X in the light-emitting complex medium 110 and may be alternately arranged with each other. Each of the plurality of first and second fiber electrodes 120 and 130 may include a conductive fiber having electrical conductivity. The conductive fiber may be made of a conductive material or may be made of a complex material including an insulating core fiber and a conductive coating covering a surface thereof. For example, the conductive material may include a conductive polymer, a metal wire, or the like. The complex material may include a polymer fiber made of an insulating polymer material such as nylon, polyester, vinylon, and acryl, etc. and a conductive metal coating layer coating a surface of the polymer fiber and made of silver (Ag), gold (Au), copper (Cu), or aluminum (Al), etc. In this case, the polymer fiber may be manufactured by twisting a plurality of yarns and includes a fiber having a diameter of several mm or smaller, for example, about 1 mm or smaller.

A first voltage may be applied to the first fiber electrodes 120 and a second voltage may be applied to the second fiber electrodes 130. For example, an AC voltage may be applied to the first fiber electrodes 120, and a ground voltage may be applied to the second fiber electrodes 130. In this case, inside the light-emitting complex medium 110, an electric field may be generated between the first fiber electrodes 120 and the second fiber electrodes 310, such that light may be generated inside the light-emitting complex medium 110 via the electric field.

In one embodiment, as shown in FIG. 1B, the plurality of first fiber electrodes 120 and the plurality of second fiber electrodes 130 may be arranged at an imaginary same plane "a" located within the light-emitting complex medium 110.

In another embodiment, as shown in FIG. 1C, the plurality of first fiber electrodes 120 may be arranged at an imaginary first plane "a", while the plurality of second fiber electrodes 130 may be arranged at an imaginary second plane "a" parallel to and different from the first plane "a". The second fiber electrodes 130 may be alternately arranged with the first fiber electrodes 120.

The first voltage application member 140 may apply the first voltage to the first fiber electrodes 120, and the second voltage application member 150 may apply the second voltage to the second fiber electrodes 130.

The first voltage application member 140 may be electrically connected to one ends of the first fiber electrodes 120, and the second voltage application member 150 may be electrically connected to one ends of the second fiber electrodes 130. In one example, FIG. 1A shows that the first and second voltage application members 140 and 150 are disposed outside the light-emitting complex medium 110. Alternatively, at least one of the first and second voltage application members 140 and 150, for example, both of the first and second voltage application members 140 and 150 may be embedded within the light-emitting complex medium 110.

In one embodiment, when the polymer matrix is made of polydimethylsiloxane (PDMS), and the nano light-emitting material includes a zinc sulfide (ZnS) quantum dot, the flexible light-emitting device 100 may perform electroluminescence (EL) by the electric field generated between the first and second fiber electrodes 120 and 130 as described above and ML (mechano-luminescence) by mechanical stress applied to the light-emitting complex medium 110.

FIG. 2 is a perspective view illustrating a flexible light-emitting device according to another embodiment of the present disclosure.

Referring to FIG. 2, a flexible light-emitting device 200 according to another embodiment of the present disclosure may include a light-emitting complex medium 210, a plurality of first fiber electrodes 220, a plurality of second fiber electrodes 230, a third fiber electrode 260, a first voltage application member 240, a second voltage application member 250, and a third voltage application member 270. The components except for the light-emitting complex medium 210 and the third fiber electrode 260 are substantially the same as or similar to those of the flexible light-emitting device 100 as described with reference to FIG. 1A to FIG. 1C. Thus, duplicate detailed descriptions thereof will be omitted below.

The light-emitting complex medium 210 may include a first medium layer 121 that generates light of a first wavelength and a second medium layer 122 that is stacked on the first medium layer 121 and generates light of a second wavelength that is different from the first wavelength.

The first medium layer 121 may include a first polymer matrix and a first nano light-emitting material dispersed therein. The second medium layer 122 may include a second polymer matrix and a second nano light-emitting material dispersed therein.

The first polymer matrix and the second polymer matrix may be made of different polymer materials, but may be made of the same polymer material. In the latter case, a single polymer matrix may be formed.

The first nano light-emitting material may include a first quantum dot that generates light of the first wavelength, and the second nano light-emitting material may include a second quantum dot that generates light of the second wavelength.

Since the materials of the first and second polymer matrices and the materials of the first and second nano light-emitting materials have already been described above, redundant descriptions thereof are omitted.

Each of the first and second fiber electrodes 220 and 230 may include a conductive fiber having electrical conductivity. The first and second fiber electrodes 220 and 230 may extend in parallel to each other in the first direction X in the first medium layer 211 and may be alternately arranged with each other.

A first voltage may be applied to the first fiber electrodes 220 and a second voltage may be applied to the second fiber electrodes 230. For example, an alternating voltage may be applied to the first fiber electrodes 220, and a ground voltage may be applied to the second fiber electrodes 230. In this case, inside the first medium layer 211, an electric field may be generated between the first fiber electrodes 220 and the second fiber electrodes 230, such that the electric field may allow generating light of the first wavelength in the first medium layer 211.

The first and second fiber electrodes 220 and 230 are substantially the same as the first and second fiber electrodes 120 and 130 of the flexible light-emitting device 100 as described with reference to FIG. 1A to FIG. 1C. Thus, redundant descriptions thereof are omitted.

The third fiber electrode 260 may be disposed inside the second medium layer 212, and a third voltage may be applied thereto. In this case, the third voltage may be a voltage different from the first and second voltages, or may be the same voltage as one of the first and second voltages.

When the third voltage different from the first and second voltages is applied to the third fiber electrode 260, a vertical electric field may be generated between the first fiber electrode 220 and the third fiber electrode 260 and between the second fiber electrode 230 and the third fiber electrode 260. This vertical electric field may allow generating light of the first wavelength in a portion of the first medium layer 211 and light of the second wavelength in a portion of the second medium layer 212.

In one example, when the third voltage equal to one of the first and second voltages is applied to the third fiber electrode 260, a vertical electric field may be generated between the third fiber electrode 260 and one of the first and second fiber electrodes 220 and 230 to which a voltage different from the third voltage is applied. The vertical electric field may allow generating light of the first wavelength in a portion of the first medium layer 211 and light of the second wavelength in a portion of the second medium layer 212.

In an embodiment, a first AC voltage and a ground voltage may be applied to the first and second fiber electrodes 220 and 230, respectively, while the ground voltage may be applied to the third fiber electrode 260.

The first and second voltage application members 240 and 250 may apply the first voltage and the second voltage to the first fiber electrodes 220 and the second fiber electrodes 230, respectively. The third voltage application member 270 may apply the third voltage to the third fiber electrode 260.

In one embodiment, when the third voltage different from the first and second voltages is applied to the third fiber electrode 260, the third voltage application member 270 may be an independent component insulated from the first and second voltage application members 240 and 250. Alternatively, when the third voltage equal to one of the first and second voltages is applied to the third fiber electrode 260, one of the first and second voltage application members 240 and 250 to which the same voltage as the third voltage is applied may function as the third voltage application member 270.

In one embodiment, the third fiber electrode 260 may include a conductive fiber patterned to have a predetermined shape. In this case, in the light-emitting complex medium 210, the first medium layer 211 may emit background light in a surface light emission manner, and, at the same time, the second medium layer 212 may emit light in a shape corresponding to a shape of the second fiber electrode 260.

In another embodiment, the third fiber electrode 260 may include a plurality of conductive fibers extending in the first direction (X) or in a direction perpendicular to the first direction (X) and arranged in parallel with each other. In this case, the light-emitting complex medium 210 may emit a mixture of light generated in the first medium layer 211 and light generated in the second medium layer 212 in a surface light emission manner.

In the flexible light-emitting device in accordance with the present disclosure, the in-plane electric field generated between the fiber electrodes disposed inside the light-emitting complex medium may be used to generate light and, further, the generated light does not have to pass through the fiber electrodes when the generated light is emitted to an outside. Thus, even when the fiber electrode is made of a material with low light transmittance, the device may emit the light at high efficiency. Further, the light may be generated at high efficiency regardless of a thickness of the light-emitting complex medium. Those are advantages over the conventional light-emitting device in which the light-emitting layer is disposed between the two electrodes having the planar structure, and thus, when light generated from the light-emitting layer is emitted to the outside, the light must pass through one of the two planar electrodes.

Hereinafter, Present Examples and Experimental Examples of the present disclosure will be described in detail. However, the following Examples are merely one embodiment of the present disclosure, and a scope of the present disclosure is not limited to the following Examples.

Present Example 1

FIG. 3 is a view for illustrating a method of manufacturing a light-emitting device according to Present Example 1.

As shown in FIG. 3, 16 Ag-coated nylon fibers were disposed onto a glass substrate in a fully stretched manner while maintaining a gap of about 300 μm from the glass substrate such that the 16 Ag-coated nylon fibers are embedded in a center of the light-emitting complex medium layer. Subsequently, in order to form the light-emitting complex medium layer, liquid PDMS containing a curing agent at a weight ratio of 9:1 and a green light-emitting ZnS phosphor were mixed with each other at a weight ratio of 7:3. The uncured PDMS+ZnS(G) mixture was dropped onto the glass substrate on which the fibers were placed, and then the mixture was cured for 30 minutes in an oven at 70° C. Then, a copper tape was attached to each of exposed ends of first fiber electrodes to which the AC voltage is applied and the second fiber electrodes to which the ground voltage is applied. In this way, a light-emitting device of Present Example 1 was manufactured.

Present Example 2

FIG. 4 is a view for illustrating a method for manufacturing a light-emitting device according to Present Example 2.

As shown in FIG. 4, 16 Ag-coated nylon fibers were disposed onto a glass substrate in a fully stretched manner while a gap between the fibers and the glass substrate is absent such that the 16 Ag-coated nylon fibers are embedded in a center of the light-emitting complex medium layer. Subsequently, in order to form a first medium layer, liquid PDMS containing a curing agent in a weight ratio of 9:1 and a green light-emitting ZnS phosphor were mixed with each other at a weight ratio of 7:3. The uncured PDMS+ZnS (G) mixture was dropped onto the glass substrate on which the fibers were placed, followed by curing the mixture for 30 minutes in an oven at 70° C. Subsequently, a zig-zag pattern-shaped fiber was placed such that a gap of about 200 μm between the fiber and the first medium layer was maintained. Liquid PDMS containing the curing agent in a weight ratio of 9:1 and orange light-emitting ZnS phosphor were mixed with each other in a weight ratio of 7:3. The uncured PDMS+ZnS (O) mixture was dropped onto the first medium layer on which the patterned fiber was placed and was cured under an ambient atmosphere at room temperature for 24 hours. Then, a copper tape is attached to each of exposed ends of alternately arranged first and second fiber electrodes fixed inside the first medium layer and receiving an AC voltage and a ground voltage respectively. A copper tape was attached to an exposed end of the patterned third fiber electrode fixed in the second medium layer. In this way, the light-emitting device of Present Example 2 was manufactured.

Experimental Example

FIG. 5A shows optical and SEM cross-sectional images (b) of a light-emitting device of Present Example 1 and a photograph (c) showing electroluminescence under 500 Vrms voltage application condition at 1 KHz frequency of Present Example 1. FIG. 5B shows optical and SEM images (d, e) and EDS images (f, g) of 130 μm diameter Ag-coated nylon fiber having dozens of nylon yarns and a 200 nm thick Ag coating layer. FIG. 5C shows photographs showing ML light emission (h) induced by pen stimulation to the light-emitting device of Present Example 1, and EL light emission (i) while the light-emitting device of Present Example 1 is wound around the pen.

Referring to FIG. 5A, the conductive fiber is embedded in the center of the light-emitting complex medium. After applying the AC voltage thereto, the in-plane AC field generated between the first fiber electrodes and the second fiber electrodes excites the ZnS phosphor such that the EL has been effectively generated.

Referring to FIG. 5B, it may be seen that a silver coating layer of about 200 nm thickness is formed on a surface of a nylon fiber of about 130 μm in diameter composed of dozens of silver coated nylon yarns of about 20 μm in diameter.

Referring to FIG. 5C, the complex of PDMS and ZnS is widely known as an ML source. The light-emitting device of Present Example 1 achieved ML light emission via pen writing thereon, and EL light emission stably without loss of luminance even when the pen was wound around the device. In the light-emitting device of Present Example 1, most of ML emission is generated from the surface of the light-emitting complex medium. Thus, ML performance is not hindered by the embedded fiber electrodes. Further, PDMS is a soft and flexible matrix. Thus, the light-emitting device of Present Example 1 exhibits high flexibility.

FIG. 6 shows a photograph (a) of ML light emission induced by pulling of the light-emitting device of Present Example 1 by hand, ML light-emission spectrum (b) based on a stretching-releasing (S-R) rate increasing from 100 cpm (cycles per minute) to 500 cpm (cycles per minute), and ML intensity (c) over time as obtained by integrating an spectral intensity from 400 nm to 800 nm over 5000 cycles, and a magnified graph (d) thereof.

Referring to (a) of FIG. 6, the light-emitting device of Present Example 1 achieved ML of the same green color as the color of PL and EL when the device has been stretched by hand.

Referring to (b) to (d) of FIG. 6, when the light-emitting device of Present Example 1 is periodically stretched or released using a stretching-releasing system with a stretching condition of 10%, an intensity of the green ML spectrum increased as the S-R rate increases from 100 cpm (cycles per minute) to 500 cpm. The CIE coordinates of the ML spectrum were (0.23, 0.58), representing a typical green color emission.

A time-resolution ML intensity of a S-R motion (40 cpm, integration time=10 ms) over 5000 cycles was investigated. ML intensity was kept without degradation for 5000 cycles of S-R motion. Slight increase in the ML intensity seen in an initial state is believed to be due to rearrangement of ZnS particles between adjacent fiber electrodes. However, this change has been stabilized after 500 cycles. In one example, as shown in (d) of FIG. 6, ML emission was generated during the stretching and releasing motion.

The above results are consistent with previous reports. It is determined that the fiber electrodes generate multiple emissions in the light-emitting device without reducing the ML performance of the light-emitting device of Present Example 1.

FIG. 7 shows a photograph (a) of EL light-emission as measured in the light-emitting device in Present Example 1, a graph (b) showing a voltage-luminance relationship under conditions of various frequencies (100, 500, 1000 and 2000 Hz), and a voltage-luminance graph (c) and a voltage-current graph (d) based on a bending cycle.

Referring to FIG. 7, when an electric field is generated by applying the AC voltage to the first fiber electrodes and the ground voltage to the second fiber electrodes, the light-emitting device of Present Example 1 effectively generates green light. In this connection, luminance increases as the electric field and frequency increase. Further, in the light-emitting device of Present Example 1, a luminance value changed over a range of several tens of $cd/m^2$ as typically observed under frequency conditions of several kHz in an alternating current-driven EL element based on a conventional PDMS+ZnS complex. From these results, it may be seen that the AC field applied between the parallel electrodes of the light-emitting device of Present Example 1 exhibits a comparable voltage-current relationship as compared with a conventional EL element employing flat electrodes.

Further, as shown in (c) and (d) of FIG. 7, it was identified that the light-emitting device of Present Example 1 exhibited stable voltage-luminance and voltage-current behavior after 10,000 bending cycles (bending radius=3 mm). From these results, it may be seen that the light-emitting device of Present Example 1 does not generate any electrical short during 10,000 bending cycles, and has excellent flexibility and durability.

FIG. 8A shows images showing simulated electric field distribution (a) and optical field distribution (b) in a light-emitting element with a pair of fiber electrodes, and images showing simulated electric field distribution (f) and optical field distribution (g) in a light-emitting element having a plurality of pairs of fiber electrodes. FIG. 8B shows a cross-sectional image (c) when AC voltage is applied to the light-emitting device of Present Example 1 having multiple of pairs of fiber electrodes, and a cross-sectional image (d) when the AC voltage is not applied thereto, and a contour image (e) evaluated in terms of a light intensity thereof. FIG. 8C shows images of light emission of the light-emitting device of Present Example 1.

Referring to FIG. 8A to FIG. 8C, when only a pair of fiber electrodes are used to generate an electric field therebetween, the fiber electrodes may affect the extraction of light to the outside (see (a) and (b) in FIG. 8A) due to opaque and non-light-emitting properties of the fiber electrodes. When a plurality of pairs of fiber electrodes are used, light is generated radially around each fiber electrode due to a complex electric field formed between neighboring fiber electrodes (see (d) and (e) in FIG. 8B).

Simulation of a light-emitting element having a plurality of pairs of fiber electrodes was performed to identify such a light-emitting profile. From the simulation result, it was found that the highest electric and optical fields originate from the fiber electrodes (see (f) and (g) in FIG. 8A). A result of simulation of the light-emitting element having only the pair of fibers did not show such a trend. Thus, this suggests that the higher electric field in the radial direction is caused by the influence between the neighboring fiber electrodes. Since the number of electric field lines depends on a charge amount of each electrode, and a density of the electric field lines is inversely proportional to a distance, the density of the spatially defined electric field lines is the highest at the fiber electrode surface. Further, because of the interaction between neighboring fiber electrodes, the density of the total electric field lines was high in an upward direction and the electric field in the radial direction was generated. Therefore, luminescence occurred mainly near the fiber electrodes.

The magnified light-emitting photograph identifies such light-emitting properties. A linear light-emitting region coincided with positions of the fiber electrodes (see (h) and (I) in FIG. 8C).

From the above results, it may be seen that in the light-emitting device according to the present disclosure, the light-emitting region originates from the high radial electric field generated near the surfaces of the fiber electrodes, and the fiber electrodes do not affect the extraction of the generated light to the outside. As a result, it is determined that when adjusting the distance between the fiber electrodes, the light emission device in accordance with the present disclosure may realize uniform surface light emission.

FIG. 9 shows schematic images (a, b) of a light emitting device of Present Example 2, an orange background light-emission image (d), a green zig-zag pattern light-emission image (e), simultaneous light-emission images (f and g) of an orange background and a green zig-zag pattern, and EL spectrum (h) and CIE coordinates at positions I, II and III shown in (d) to (f).

Referring to FIG. 9, the patterned third fiber electrode disposed inside the second medium layer and receiving the ground voltage interacts with the first fiber electrodes disposed in the first medium layer and receiving the AC voltage to generate a vertical electric field, thereby to realize independent light emission. Specifically, the in-plane electric field formed between the first and second fiber electrodes in the first medium layer induced orange emission. The vertical electric field formed between the third fiber electrode inside the second medium layer and the first fiber electrode inside the first medium layer mainly generates green light when the first fiber electrode is disposed on a bottom of the first medium layer. Further, when the in-plane electric field formed between the first and second fiber electrodes and the vertical electric field formed between the third fiber electrode and the first fiber electrode were simultaneously applied, yellowish-colored pattern light emission appeared.

Although described above with reference to the preferred embodiments of the present disclosure, those skilled in the art will appreciate that various modifications and changes may be made in the present disclosure without departing from a spirit and scope of the present disclosure set forth in the following claims.

What is claimed is:

1. A flexible light-emitting device comprising:
   a light-emitting complex medium including a polymer matrix, and a nano light-emitting material dispersed therein, the light-emitting complex medium generating light via application of an electric field thereto;
   a plurality of first fiber electrodes extending in a first direction and disposed within the light-emitting complex medium, wherein the plurality of first fiber electrodes are arranged along a first imaginary plane and are spaced apart from each other, wherein a first voltage is applied to the plurality of first fiber electrodes; and
   a plurality of second fiber electrodes extending in the first direction and disposed within the light-emitting complex medium, wherein the plurality of first fiber electrodes are alternated with the plurality of second fiber electrodes, wherein a second voltage different from the first voltage is applied to the plurality of second fiber electrodes.

2. The flexible light-emitting device of claim 1, wherein the second fiber electrodes are arranged along the first imaginary plane.

3. The flexible light-emitting device of claim 1, wherein the second fiber electrodes are arranged along a second imaginary plane different from the first imaginary plane.

4. The flexible light-emitting device of claim 1, wherein the polymer matrix includes at least one selected from a group consisting of polydimethylsiloxane (PDMS), polymethylmethacrylate (PMMA), polycarbonate (PC), polyimide (PI), polyethylene (PE), polypropylene (PP), methacrylic, ployurethane, and polyethylene terephthalate (PET).

5. The flexible light-emitting device of claim 4, wherein the nano light-emitting material includes a quantum dot.

6. The flexible light-emitting device of claim 1, wherein each of the first fiber electrodes and the second fiber electrodes includes a conductive fiber having electrical conductivity.

7. The flexible light-emitting device of claim 1, wherein the flexible light-emitting device further comprises:

a first voltage application member electrically connected to the first fiber electrodes for applying the first voltage to the first fiber electrodes; and a second voltage application member electrically connected to the second fiber electrodes for applying the second voltage to the second fiber electrodes.

8. The flexible light-emitting device of claim 7, wherein the first voltage is an alternating current (AC) voltage and the second voltage is a ground voltage.

9. The flexible light-emitting device of claim 1, wherein the polymer matrix is made of polydimethylsiloxane (PDMS), wherein the nano light-emitting material includes a zinc sulfide (ZnS) quantum dot, wherein the light-emitting complex medium generates first light using the electric field applied thereto and generates second light using mechanical stimulus applied thereto.

10. A flexible light-emitting device comprising:
a light-emitting complex medium including:
a first medium layer including a first polymer matrix, and a first nano light-emitting material dispersed therein; and
a second medium layer including a second polymer matrix, and a second nano light-emitting material dispersed therein, wherein the second medium layer is stacked on the first medium layer;

a plurality of first fiber electrodes extending in a first direction and disposed within the first medium layer, wherein the plurality of first fiber electrodes are arranged along a first imaginary plane and are spaced apart from each other, wherein a first voltage is applied to the plurality of first fiber electrodes;

a plurality of second fiber electrodes extending in the first direction and disposed within the first medium layer, wherein the plurality of first fiber electrodes are alternated with the plurality of second fiber electrodes, wherein a second voltage different from the first voltage is applied to the plurality of second fiber electrodes; and a third fiber electrode located within the second medium layer, wherein a third voltage is applied to the third fiber electrode.

11. The flexible light-emitting device of claim 10, wherein the first polymer matrix and the second polymer matrix are made of the same material.

12. The flexible light-emitting device of claim 10, wherein the first voltage is an alternating current voltage, the second voltage is ground voltage, and the third voltage is one of the alternating current voltage and the ground voltage.

* * * * *